United States Patent
Huang

(10) Patent No.: US 9,306,098 B2
(45) Date of Patent: Apr. 5, 2016

(54) METHOD OF MAKING PHOTOVOLTAIC DEVICE COMPRISING AN ABSORBER HAVING A SURFACE LAYER

(71) Applicant: TSMC SOLAR LTD., Taichung (TW)

(72) Inventor: Chien-Yao Huang, New Taipei (TW)

(73) Assignee: TSMC Solar Ltd., Taichung (TW)

( * ) Notice: Subject to any disclaimer, the term of this patent is extended or adjusted under 35 U.S.C. 154(b) by 48 days.

(21) Appl. No.: 14/162,932

(22) Filed: Jan. 24, 2014

(65) Prior Publication Data

US 2015/0214399 A1     Jul. 30, 2015

(51) Int. Cl.
| | |
|---|---|
| H01L 21/00 | (2006.01) |
| H01L 31/032 | (2006.01) |
| H01L 31/0352 | (2006.01) |
| H01L 31/18 | (2006.01) |
| H01L 31/0224 | (2006.01) |

(52) U.S. Cl.
CPC .... *H01L 31/0322* (2013.01); *H01L 31/022441* (2013.01); *H01L 31/0352* (2013.01); *H01L 31/18* (2013.01); *H01L 31/1864* (2013.01); *Y02P 70/521* (2015.11)

(58) Field of Classification Search
CPC ....................................................... H01L 21/00
See application file for complete search history.

(56) References Cited

U.S. PATENT DOCUMENTS

| | | | |
|---|---|---|---|
| 2011/0168258 A1* | 7/2011 | Palm | H01L 31/0322 136/258 |
| 2012/0171847 A1* | 7/2012 | Robinson | H01L 21/02568 438/478 |

* cited by examiner

*Primary Examiner* — Marvin Payen
(74) *Attorney, Agent, or Firm* — Duane Morris LLP

(57) ABSTRACT

A method of fabricating a photovoltaic device includes a step of forming an absorber layer above a substrate, and a step of forming a surface layer on the absorber layer. The absorber layer includes an I-III-VI$_2$ compound, which contains a Group I element, a Group III element and a Group VI element. The surface layer includes an I-III-VI$_2$ compound, which contains a Group I element, a Group III element and a Group VI element, and has an atomic ratio of the Group I element to the Group III element in the range of from 0.1 to 0.9.

15 Claims, 13 Drawing Sheets

Ternary phase diagram of the Cu-In-Se system.

METHOD OF MAKING PHOTOVOLTAIC DEVICE COMPRISING AN ABSORBER HAVING A SURFACE LAYER

BACKGROUND

The disclosure relates to photovoltaic devices generally, and more particularly relates to a method for making a photovoltaic device comprising a I-III-VI2 compound as an absorber, and the resulting photovoltaic device.

Photovoltaic devices (also referred to as solar cells) absorb sun light and convert light energy into electricity. Photovoltaic devices and manufacturing methods therefore are continually evolving to provide higher conversion efficiency with thinner designs.

Thin film solar cells are based on one or more layers of thin films of photovoltaic materials deposited on a substrate. The film thickness of the photovoltaic materials ranges from several nanometers to tens of micrometers. Examples of such photovoltaic materials include cadmium telluride (CdTe), copper indium gallium selenide (CIGS) and amorphous silicon (α-Si). These materials function as light absorbers. A photovoltaic device can further comprise other thin films such as a buffer layer, a back contact layer, and a front contact layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

DETAILED DESCRIPTION

Figure 1A:
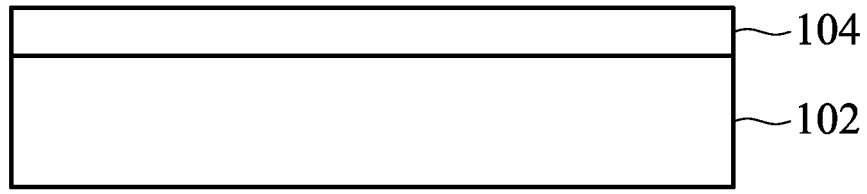
FIGS. 1A-1D are cross-sectional views of a portion of an exemplary photovoltaic device during fabrication, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In a thin-film photovoltaic device, a back contact layer is deposited over a substrate. An absorber layer is deposited over the back contact layer. A buffer layer comprising a suitable buffer material is disposed above an absorber layer. The buffer layer and the absorber layer, which both comprise a semiconductor material, provide a p-n or n-p junction. When the absorber layer absorbs sun light, electric current can be generated at the p-n or n-p junction.

A "I-III-VI$_2$" compound such as copper indium gallium selenide and/or sulfide (CIGS) can be used as an absorber layer in thin film solar cells. CIGS thin film solar cells have achieved excellent conversion efficiency.

Unless expressly indicated otherwise, references to a "front side" of a substrate made in this disclosure will be understood to encompass the side on which a light absorber layer will be deposited. References to a "back side" of the substrate made below will be understood to encompass the other side of the substrate opposite the absorber. References to a "substrate" will be understood to encompass a substrate with or without a back contact layer, for example, a metal coated glass substrate. When the substrate is a metal coated glass, the "back side" is the glass layer while the "front side" is the metal layer deposited over the glass layer as the back contact layer.

Unless expressly indicated otherwise, references to a "I-III-VI$_2$ compound" made in this disclosure will be understood to encompass a material selected from a Group I element, a Group III element, an alloy or any combination thereof. The Group I element can be selected from Cu or Ag. The Group III element can be selected from Al, Ga, In or Tl. The Group VI element can be sulfur or selenium (Se). In this disclosure, Group I, Group III, and Group VI refer to Group IB, Group IIIA and Group VIA, respectively, in the "traditional" periodic table. Based on the modern numbering system recommended by the International Union of Pure and Applied Chemistry (IUPAC), Group I, Group III, and Group VI refer to Group 11, Group 13 and Group 16, respectively.

Unless expressly indicated otherwise, references to "CIGS" made in this disclosure will be understood to encompass a material comprising copper indium gallium sulfide and/or selenide, for example, copper indium gallium selenide, copper indium gallium sulfide, and copper indium gallium sulfide/selenide. A selenide material may comprise sulfide or selenide can be completely replaced with sulfide.

In some embodiments, an absorber layer comprising a "I-III-VI$_2$ compound" is made by a process comprising three steps. Metal precursors comprising a Group I and a Group III element 105 are first deposited. Selenization is then performed followed by sulfuration. For example, selenization occurs at a temperature ($T_1$) in the range of from 350° C. to 450° C. for a time of period ($t_1$). The temperature is then subsequently raised to $T_2$, for example, in the range of from 500° C. to 550° C., at which sulfuration is carried out for a time of period ($t_2$). Sulfur can replace selenium in the process of sulfuration following selenization. This process provides uniform absorber layer in large areas. However, the resulting absorber layer and subsequently formed buffer layer may form a heterojunction having a large number of defects in the interface. The charge recombination due to the large number of defects causes a drop in the quantum efficiency.

The present disclosure provides a method for fabricating a photovoltaic device, and a resulting photovoltaic device such as a thin film solar cell having a surface layer on an absorber layer. The absorber layer comprises at least one "I-III-VI$_2$" compound comprising a Group I element, a Group III element, and a Group VI element. The surface layer on the absorber layer has tailored atomic distributions, particularly of the Group I elements (e.g., Cu and Ag) and the Group III elements (e.g., Ga and Tl). The surface layer comprises a I-III-VI$_2$ compound which has an atomic ratio of the Group I element to the Group III element in the range of from 0.1 to 0.9, for example, in the range from 0.1 to 0.7 (e.g., from 0.5 to 0.7). Such a surface layer provides an enlarged band gap and an inverted carrier (e.g., n-type carrier) to form a buried junction with the absorber layer (e.g., p-type absorber layer). Such a surface layer will reduce recombination loss and result in improved open-circuit voltage (Voc) and fill factor (FF), and ultimately the performance of the resulting photovoltaic device.

Figure 1B:
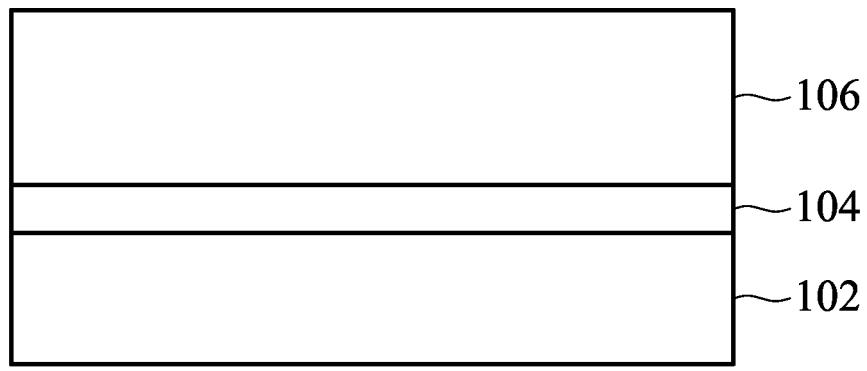
Figure 1C:
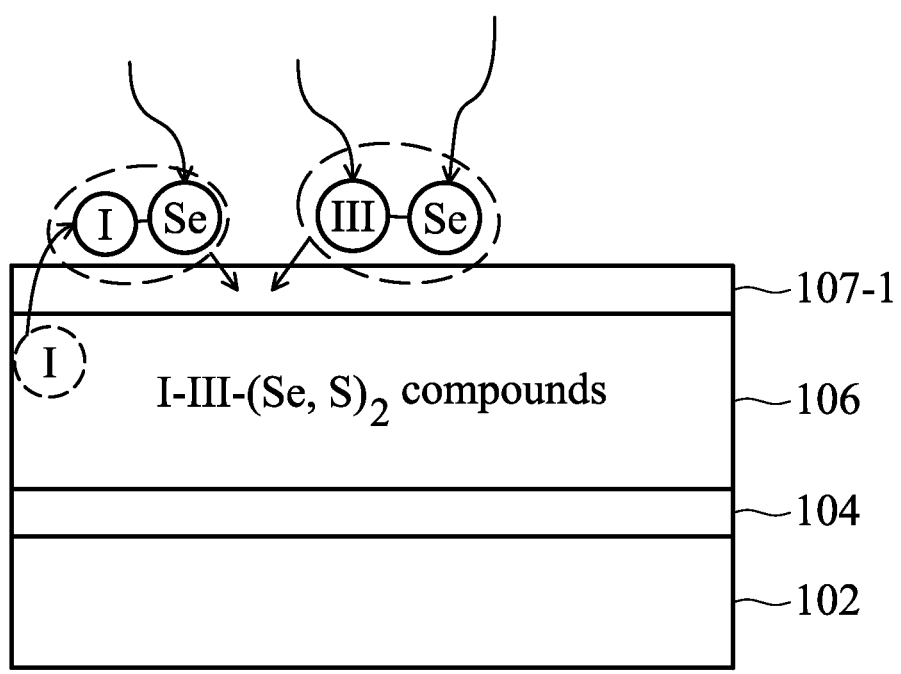
Figure 1D:
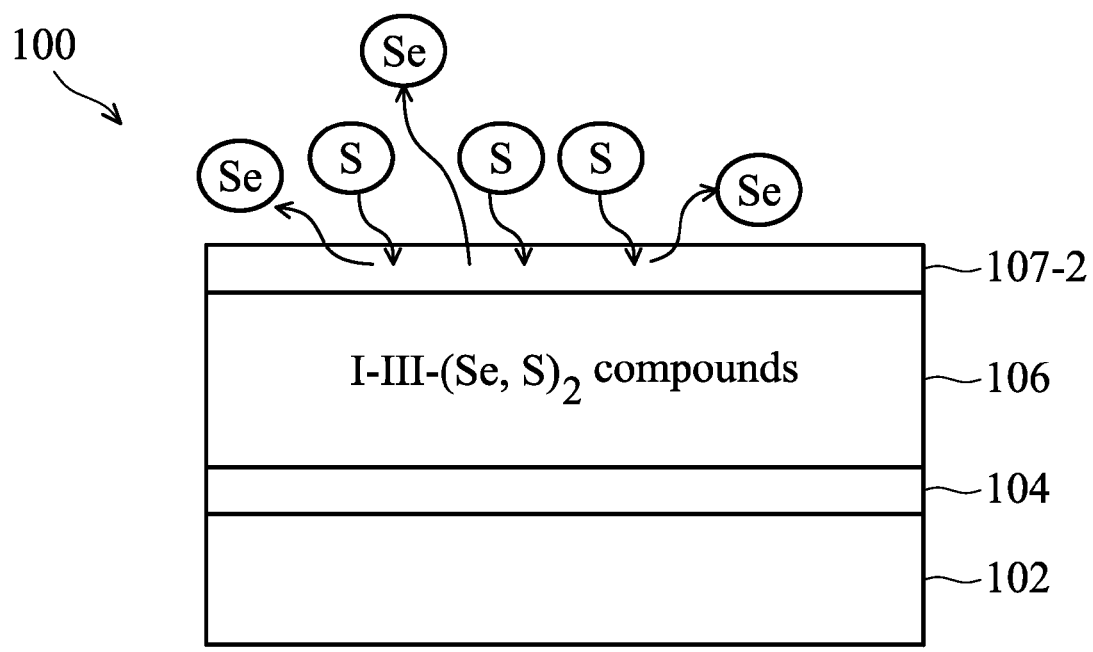

In FIGS. 1A-1D, like items are indicated by like reference numerals, and for brevity, descriptions of the structure, provided above with reference to the previous figure, are not repeated. The methods are described in FIGS. 2A-2D with reference to the exemplary structure described in FIGS. 1A-1D. FIGS. 1A-1D show a solar cell at two different stages in the fabrication process. As shown in FIG. 1A, a back contact layer 104 is formed over a substrate 102. As shown in FIG. 1B, an absorber layer 106 is formed above back contact layer 104. As shown in FIGS. 1C and 1D, a surface layer 107-2 is formed over the absorber layer 106 in accordance with some embodiments.

Figure 2A:
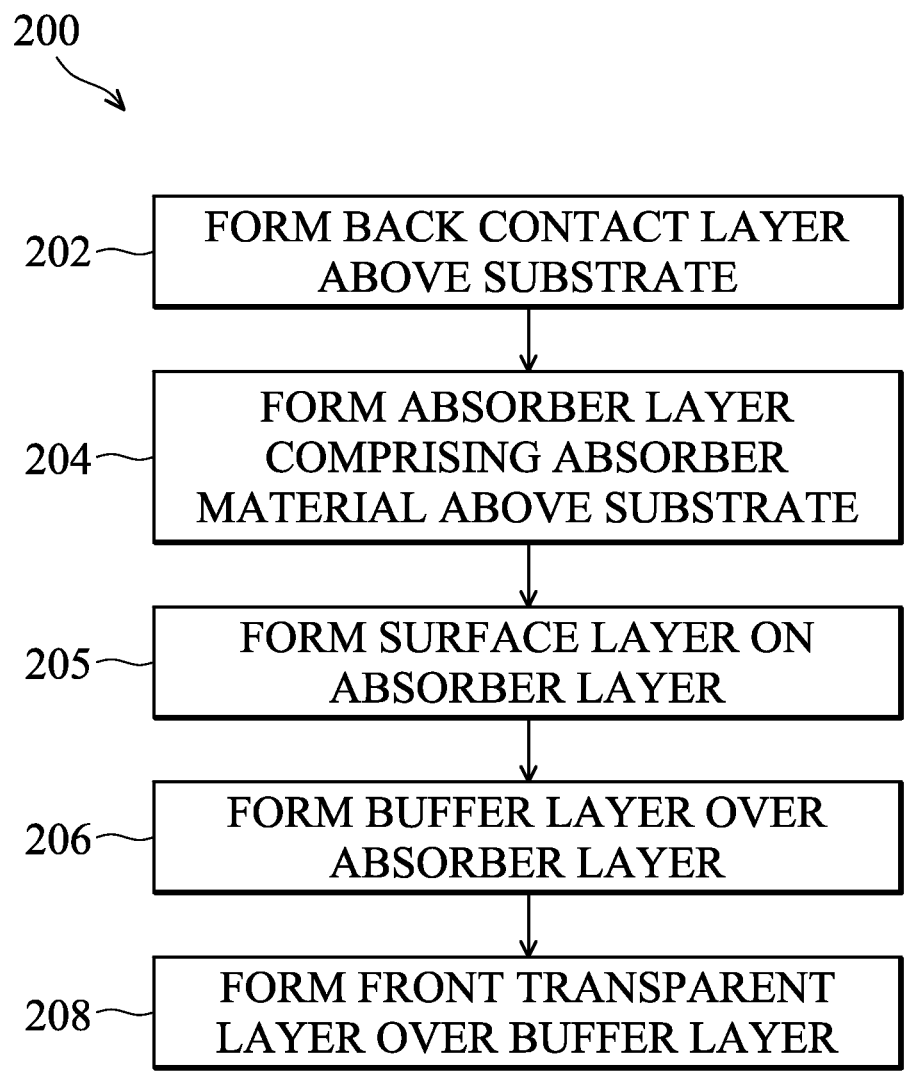
FIG. 2A is a flow chart diagram illustrating a method of fabricating an exemplary photovoltaic device in accordance with some embodiments.
Figure 2B:
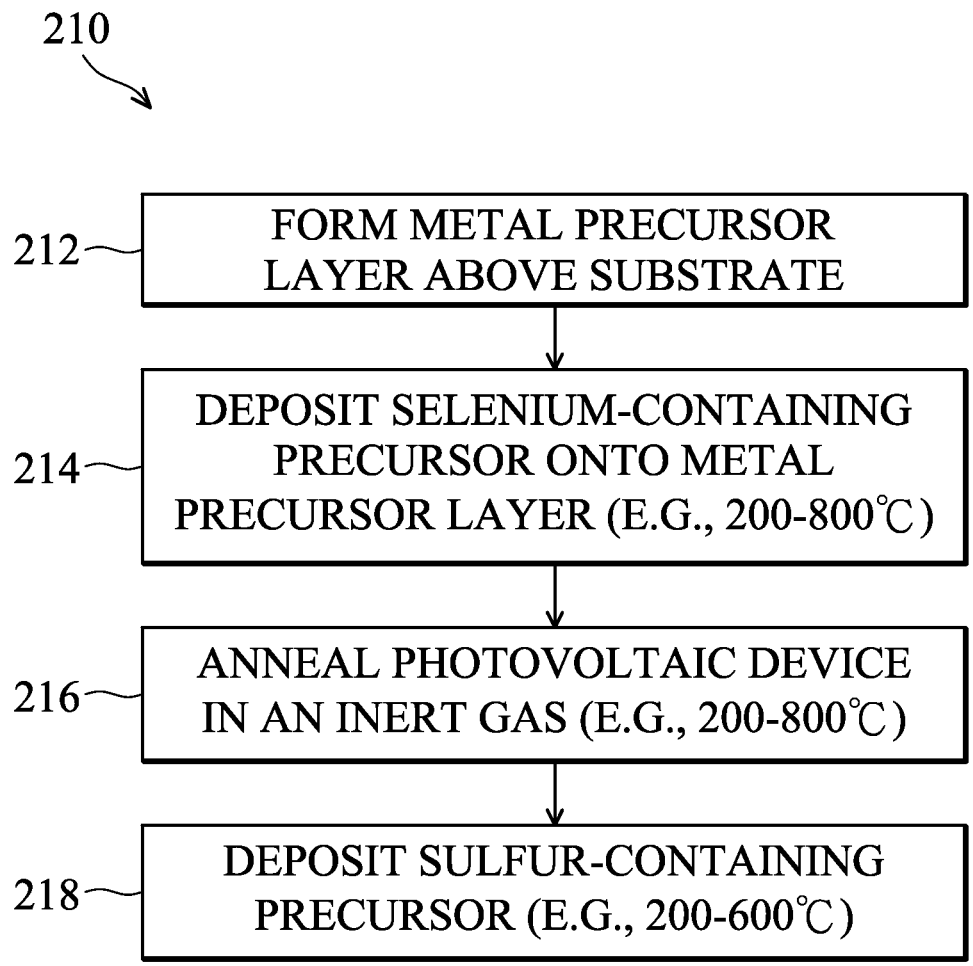
FIG. 2B is a flow chart diagram illustrating a method of forming an absorber layer in some embodiments.
Figure 2C:
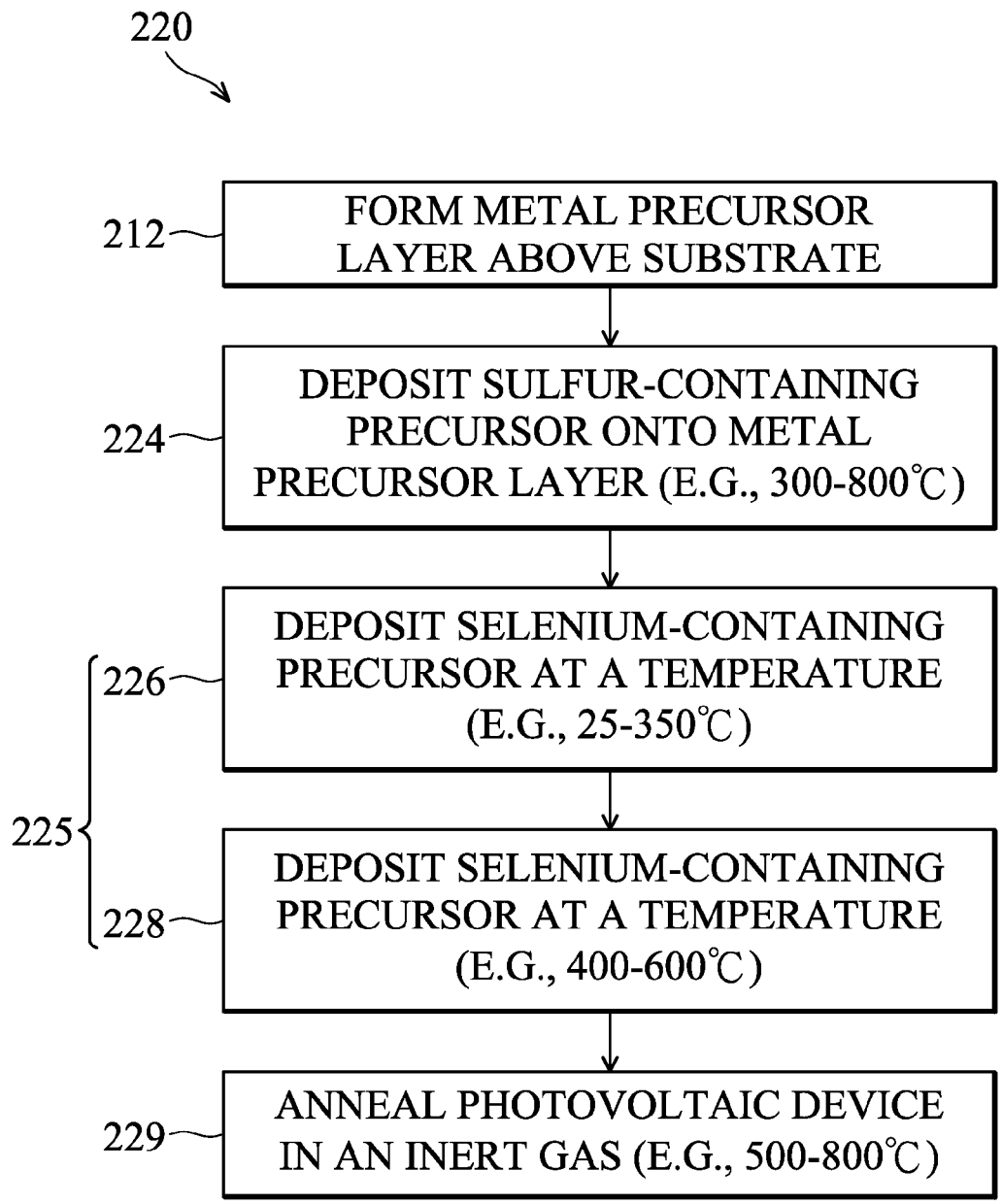
FIG. 2C is a flow chart diagram illustrating a method of forming an absorber layer in some other embodiments.
Figure 2D:
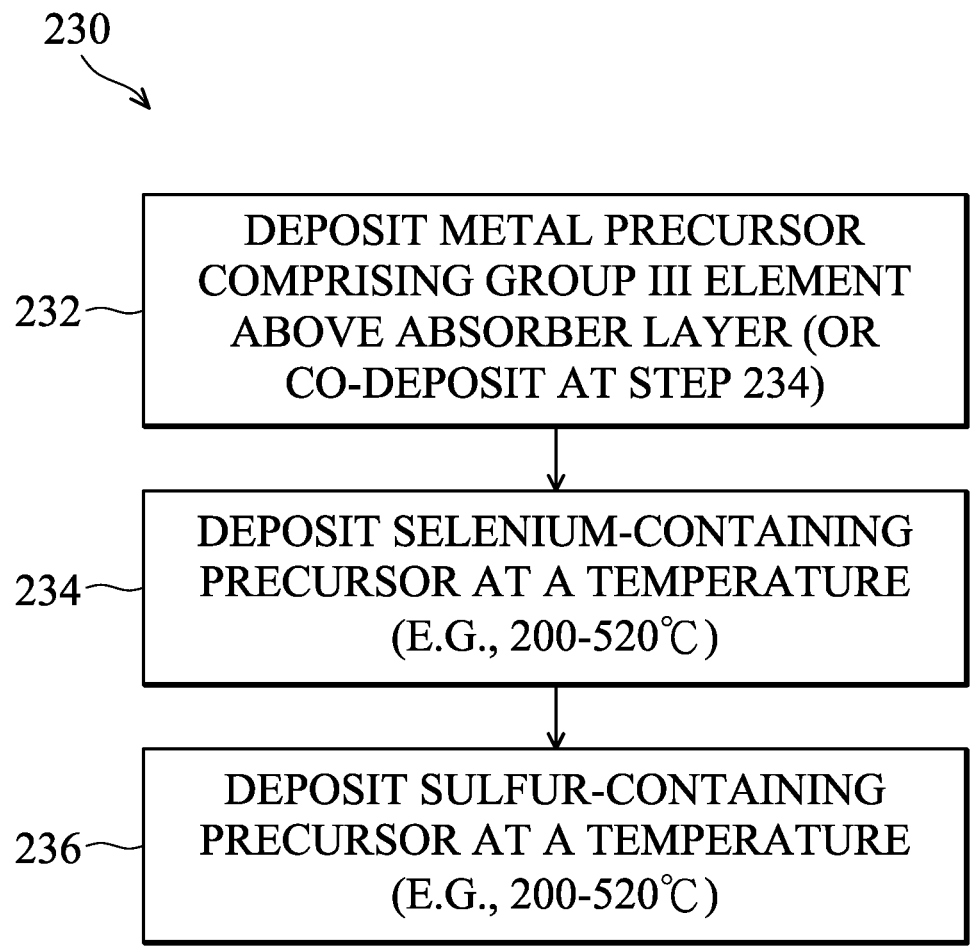
FIG. 2D is a flow chart diagram illustrating a method of forming a surface layer on an absorber layer for an exemplary photovoltaic device in accordance with some embodiments.
Figure 3:
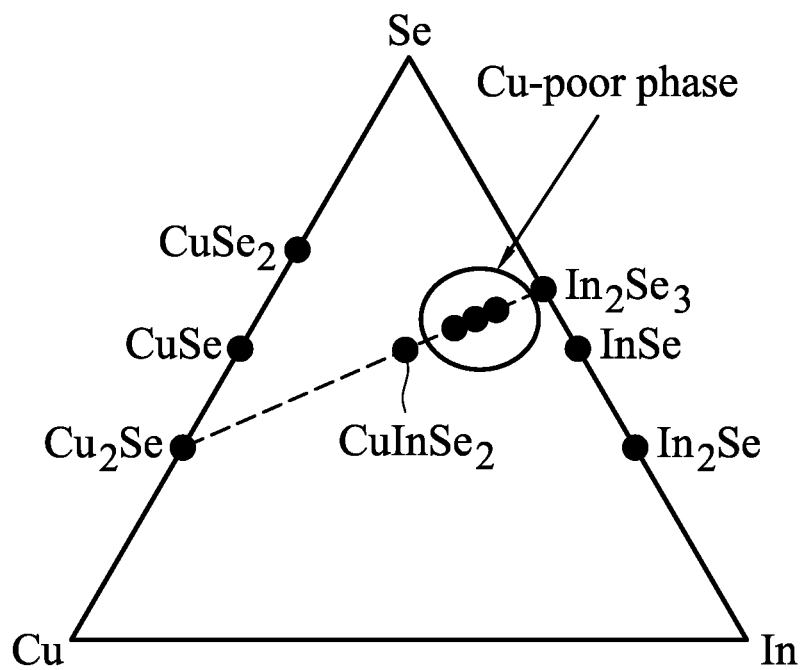
FIG. 3 shows a phase diagram of a material comprising Cu, In and Se.
Figure 4:
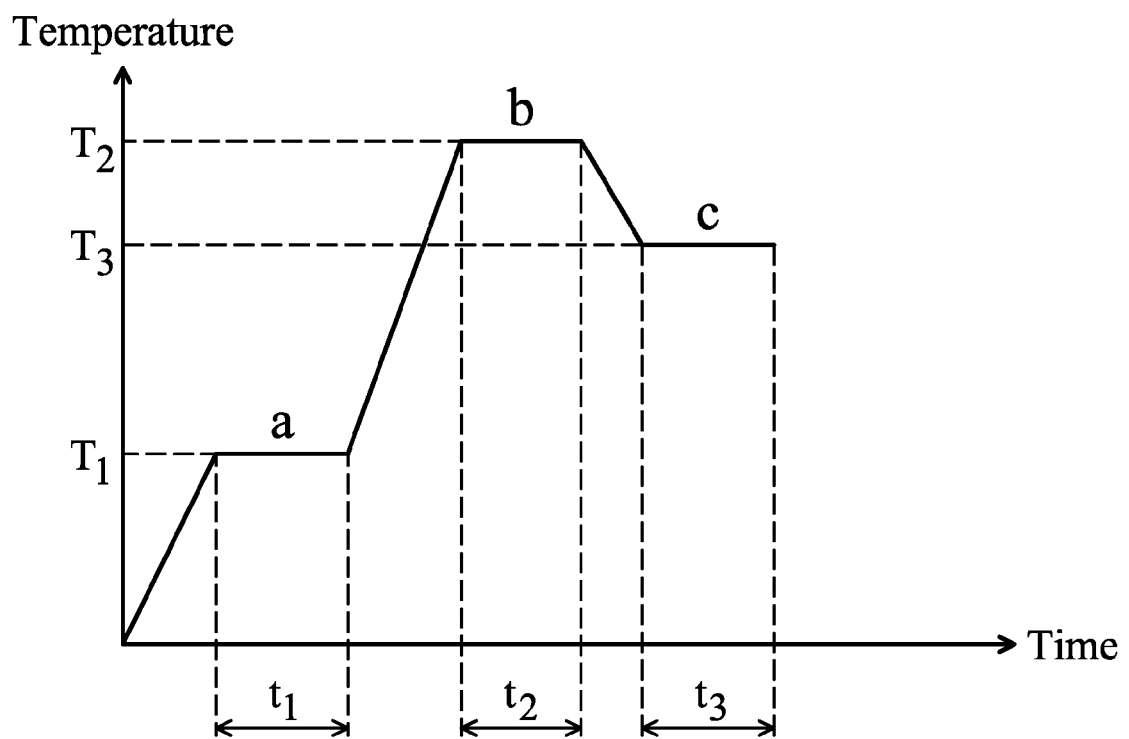
FIG. 4 illustrates an exemplary process for forming an absorber layer comprising a step of selenization and a step of annealing followed by a step of sulfuration in some embodiments.
Figure 5:
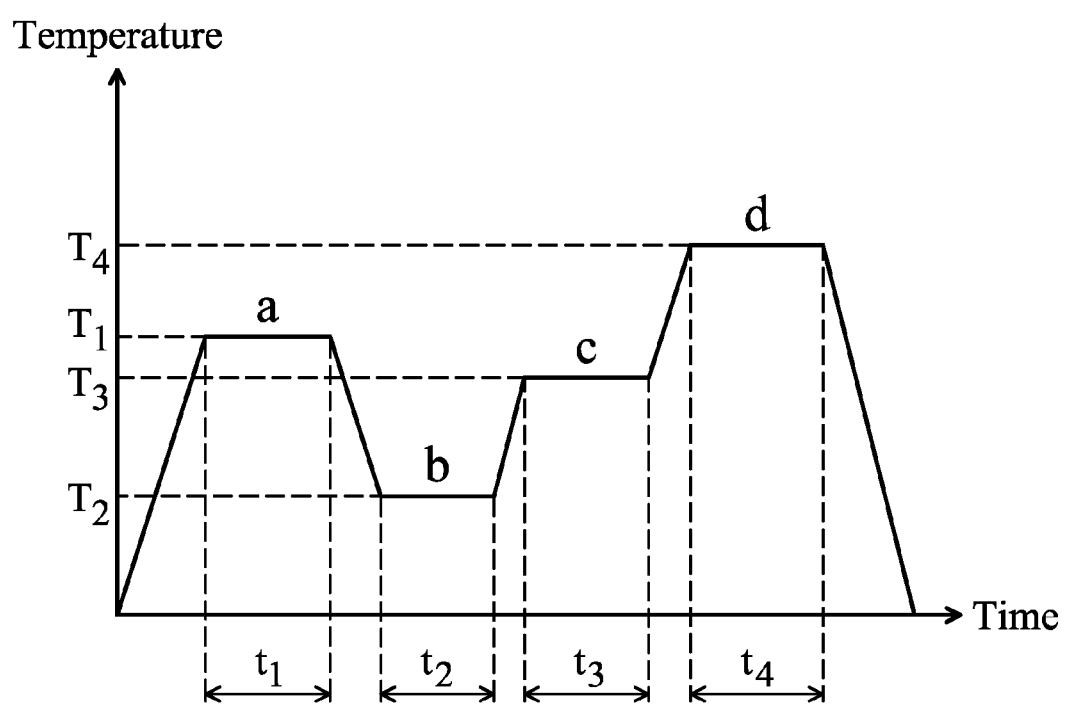
FIG. 5 illustrates a process for forming an absorber layer having tailored atomic distribution comprising a step of sulfuration, and at least one step of selenization followed by a step of annealing in accordance with some embodiments.
Figure 6:
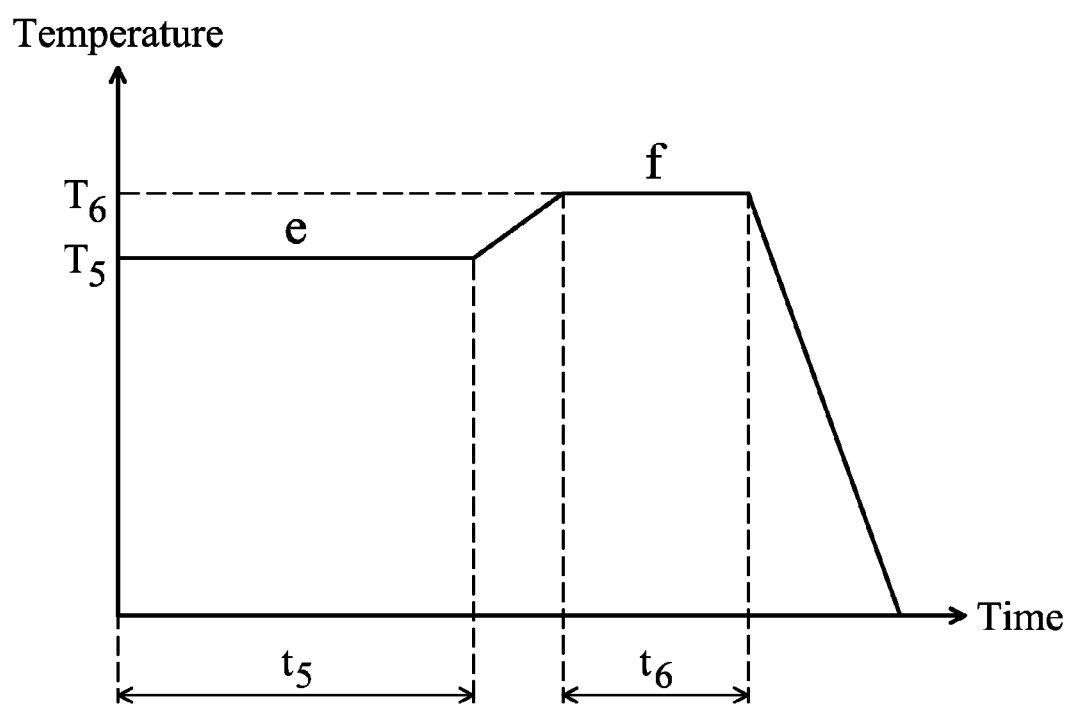
FIG. 6 illustrates a process of forming a surface layer on an absorber layer in accordance with some embodiments.
Figure 7:
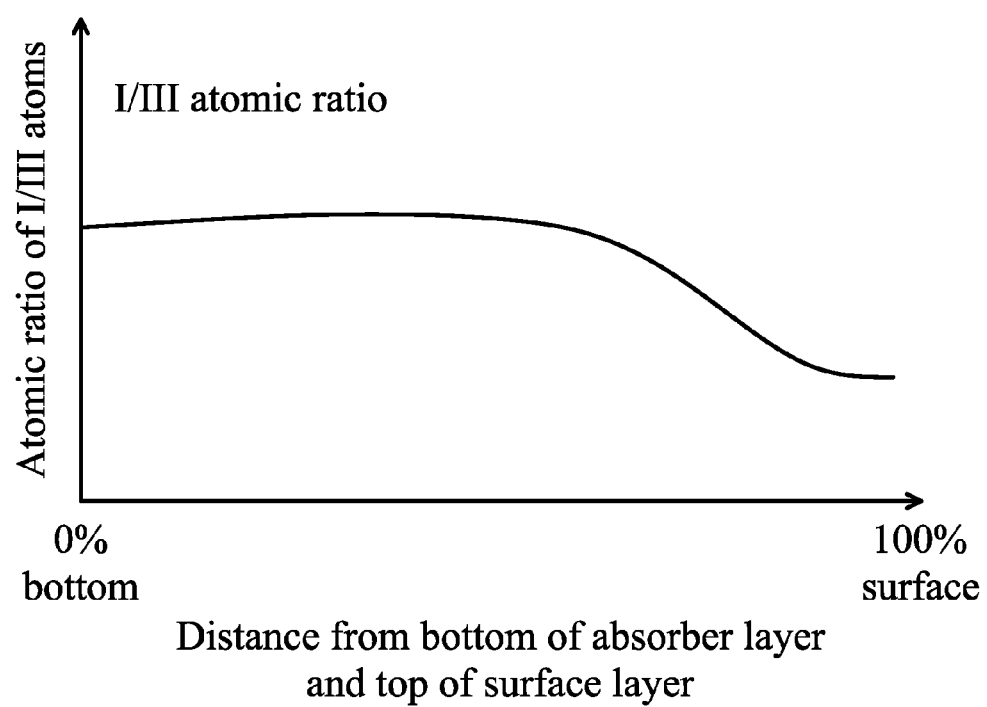
FIG. 7 illustrates a resulting profile of Group I and Group III atoms distributed across the absorber layer in some embodiments.

FIG. 2A illustrates an exemplary method 200 of fabricating an exemplary photovoltaic device 100 in accordance with some embodiments. FIG. 2B and FIG. 4 illustrate an exemplary method 210 of forming an absorber layer 106 in some embodiments. FIG. 2C and FIG. 5 illustrate another exemplary method 220 of forming an absorber layer 106 in some other embodiments. FIG. 2D and FIG. 6 illustrate an exemplary method 230 of forming a surface layer 107-2 over absorber layer 106. FIG. 3 shows an exemplary phase diagram of a material comprising Cu, In and Se. FIG. 7 illustrates a resulting profile of Group I and Group III atoms distributed across absorber layer 106 in some embodiments.

At step 202 of FIG. 2A, a back contact layer 104 is formed above a substrate 102. The resulting structure of a portion of a photovoltaic device 100 is illustrated in FIG. 1A.

Substrate 102 and back contact layer 104 are made of any material suitable for such layers in thin film photovoltaic devices. Examples of materials suitable for use in substrate 102 include but are not limited to glass (such as soda lime glass), polymer (e.g., polyimide) film and metal foils (such as stainless steel). The film thickness of substrate 102 is in any suitable range, for example, in the range of 0.1 mm to 5 mm in some embodiments.

In some embodiments, substrate 102 can comprise two or more layers. For example, substrate 102 can include a first layer 101 (not shown) comprising glass, and a second layer 103 (not shown) disposed over the first layer and comprising silicon dioxide, which can be used to block possible diffusion of sodium in glass. In some embodiments, layer 101 comprises soda lime glass or other glass, which can tolerate a process at a temperature higher than 600° C. In some embodiments, layer 103 comprises silicon oxide having a formula $SiO_x$, where x ranges from 0.3 to 2.

Examples of suitable materials for back contact layer 104 include, but are not limited to molybdenum (Mo), copper, nickel, or any other metals or conductive material. Back contact layer 104 can be selected based on the type of thin film photovoltaic device. For example, back contact layer 104 is Mo in some embodiments. The thickness of back contact layer 104 is on the order of nanometers or micrometers, for example, in the range from 100 nm to 20 microns. The thickness of back contact layer 104 is in the range of from 200 nm to 10 microns in some embodiments. Back contact layer 104 can be also etched to form a pattern.

At step 204 of FIG. 2A, an absorber layer 106 comprising an absorber material is formed above back contact layer 104 and above substrate 102. The resulting structure of photovoltaic device 100 is as illustrated in FIG. 1B.

Absorber layer 106 can be a p-type or n-type semiconductor material. Examples of materials suitable for absorber layer 106 include but are not limited to copper indium gallium selenide (CIGS), cadmium telluride (CdTe), and amorphous silicon (α-Si). In some embodiments, absorber layer 106 comprises a Group I element (e.g., Cu or Ag). In some embodiments, absorber layer 106 comprises a I-III-VI$_2$ compound. For example, absorber layer 106 can comprise material of a chalcopyrite family (e.g., CIGS). In some embodiments, absorber layer 106 is a semiconductor comprising copper, indium, gallium and selenium, such as $CuIn_xGa_{(1-x)}Se_2$, where x is in the range of from 0 to 1. Selenium can be also replaced with sulfur. In some embodiments, absorber layer 106 is a p-type semiconductor. Absorber layer 106 has a thickness on the order of nanometers or micrometers, for example, 0.5 microns to 10 microns. In some embodiments, the thickness of absorber layer 106 is in the range of 500 nm to 2 microns.

Absorber layer 106 can be formed according to methods such as sputtering, chemical vapor deposition, printing, electrodeposition or the like. In some embodiments, the selenium is deposited by evaporation physical vapor deposition (PVD).

Different processes can be used to form absorber layer 106 at step 204. For the illustration purpose, two exemplary methods (210 and 220) are described below.

FIG. 2B and FIG. 4 illustrate an exemplary method 210 of forming an absorber layer 106 comprising a step of selenization and a step of annealing followed by a step of sulfuration in accordance with some embodiments. Method 210 can comprise steps 212, 214, 216 and 218.

At step 212, a metal precursor layer 105 (not shown) is formed above substrate 102. Metal precursor layer 105 can comprise at least one material selected from the group consisting of a Group I element such as Cu and Ag. Metal precursor can further comprise a Group III element such as Al, Ga, In and Tl, and any alloy or combination thereof. Metal precursor layer 105 can comprise selenium (Se) in some embodiments.

Metal precursor layer 105 can be formed using any suitable method. For example, metal precursors can be formed by sputtering from at least one sputtering source in a vacuum chamber. Sputtering sources can be, for example, a magnetron, an ion beam source, a RF generator, or any suitable sputtering source configured to deposit a respective ingredient for an absorber layer. Each sputtering source can include at least one sputtering target. A suitable sputtering gas such as argon can be used. Other possible sputtering gases include krypton, xenon, neon, and similarly inert gases.

In some embodiments, more than two sputtering sources can be used to form the metal precursors. For example, a first sputtering source can be used to deposit atoms of a first ingredient (e.g., Cu, or Cu and Ga) for absorber layer. A second sputtering source can be used to deposit atoms of a second ingredient (e.g. In). The ingredients can be co-deposited or deposited at different layers at a predetermined ratio.

At step 212, metal precursor layer 105 can be in one or more than two layers. For example all the elements including both Group I and Group III elements can be co-deposited together. In some embodiments, two or three layers can be formed. For example, a bottom layer comprising Cu and Ga in any suitable atomic ratio (e.g., Cu/Ga in the range of from 70:30 to 60:40) is first deposited. A second layer comprising Cu and Ga in a different atomic ratio (e.g., Cu/Ga in the range of from 85:15 to 75:25) is then formed. A top layer comprising indium (In) can be subsequently deposited. Each layer can be at any thickness, for example, in the range from 100 nm to 900 nm. In some embodiments, a certain amount of selenium can be deposited in the course of step 212. For example, a thin layer of selenium at any thickness (e.g., 100-200 nm) can be formed as a middle layer when depositing Group I and Group III elements.

In some embodiments, during the sputtering process, indium can be doped with alkaline elements such as sodium (Na) or potassium (K). Doping an indium sputtering target with sodium may avoid or minimize an alkali-silicate layer in the solar cell.

At step 214 of FIG. 2B, a selenium-containing precursor is deposited onto the metal precursor layer 105 at a temperature ($T_1$ in FIG. 4), for example, in the range of from 200° C. to 800° C. The time length ($t_1$ in FIG. 4) for depositing a selenium-containing precursor can be in the range of from 0.1 to 300 minutes. In some embodiments, the selenium-containing precursor can comprise hydrogen selenium or elemental selenium vapor.

At step 216, the photovoltaic device is annealed in an inert gas (e.g., $N_2$, Ar or any combination thereof) at a temperature ($T_2$ in FIG. 4), for example, in the range of from 200° C. to 800° C. The time length ($t_2$ in FIG. 4) for annealing can be in the range of from 0.1 to 300 minutes.

At step 218, a sulfur-containing precursor is deposited onto the metal precursor layer 105 at a temperature ($T_3$ in FIG. 4), for example, in the range of from 200° C. to 600° C., after the step of annealing the photovoltaic device. The time length ($t_3$ in FIG. 4) for depositing a sulfur-containing precursor can be in the range of from 0.1 to 300 minutes. Examples of a sulfur-containing precursor include but are not limited to hydrogen sulfur or elemental sulfur vapor.

In some embodiments, temperatures $T_1$ and $T_3$ are lower than temperature $T_2$ as shown in FIG. 4. Temperatures $T_1$ can be also lower than temperature $T_3$ as shown in FIG. 4.

FIG. 2C and FIG. 5 illustrate another method 220 of forming an absorber layer 106 having a tailored atomic distribution comprising a step of sulfuration, and at least one step of selenization followed by a step of annealing in some other embodiments. Method 220 can comprise step 212, 224, 225 (including steps 226 and 228), and 229, as shown in FIG. 2C.

At step 212, as described above, a metal precursor layer 105 is formed above substrate 102. In some embodiments, metal precursor 105 comprises a material selected from the group consisting of a Group I element, a Group III element, an alloy or any combination thereof.

At step 224, a sulfur-containing precursor is deposited onto the metal precursor layer 105. Examples of a sulfur-containing precursor include but are not limited to hydrogen sulfur or elemental sulfur vapor. As shown in FIG. 5, the sulfur-containing precursor is deposited at a first temperature ($T_1$), which can be in the range of from 300° C. to 550° C. (e.g., from 350° C. to 450° C.). The time length ($t_1$ in FIG. 5) for depositing sulfur-containing precursor can be in the range of from 0.1 to 300 minutes.

At step 225, a selenium-containing precursor is deposited onto metal precursor layer 105 after the step of depositing a sulfur-containing precursor. In some embodiments, a selenium-containing precursor is deposited onto metal precursor layer 105 at a temperature lower than a first temperature at which the sulfur-containing precursor is deposited. In some embodiments, selenium can be deposit using an evaporation source comprising any suitable selenium containing precursor. Evaporation source can be configured to produce a vapor of such suitable selenium containing precursor. The vapor can condense upon metal precursor layer 105. In some embodiments, the vapor can be ionized, for example using an ionization discharger, prior to condensation.

In some embodiments, as shown in FIGS. 2C and 5, the step of depositing a selenium-containing precursor onto the metal precursor layer comprises two steps: step 226 and step 228. At step 226, a selenium-containing precursor is deposited at a second temperature ($T_2$ in FIG. 5). At step 228, a same or different selenium-containing precursor is deposited at a third temperature ($T_3$ in FIG. 5). $T_2$ and $T_3$ are different from each other. In some embodiments, $T_2$ and $T_3$ are lower than $T_1$. The selenium-containing precursor can comprise hydrogen selenium or elemental selenium vapor. $T_2$ can be in the range of from 25° C. to 350° C. (e.g., from 250° C. to 350° C.). $T_3$ can be in the range of from 400° C. to 600° C. (e.g., 400° C. to 500° C.). In each depositing step, the time length ($t_2$ or $t_3$) for depositing selenium precursor at each temperature can be in the range of from 0.1 to 300 minutes, respectively.

At step 229, in some embodiments, method 220 further comprises annealing the photovoltaic device in an inert gas after step 225. Annealing can be performed in an inert gas comprising nitrogen, argon or any other inert gas, or combinations thereof, at a temperature ($T_4$) in the range of from 500° C. to 800° C. (e.g., from 500° C. to 600° C.). The annealing time length ($t_4$) can be in the range from 0.1 to 300 minutes.

In some embodiments, method 220 results in a tailored atomic distribution. For example, sulfur atoms do not diffuse into the bottom of absorber layer 106 (i.e. the interface between absorber layer 106 and back contact layer 104). The bottom surface of absorber layer 106 is essentially free of sulfur. The atomic ratio of sulfur to the amount of selenium and sulfur is in the range of from 0.1 to 1.0 on an upper surface of absorber layer 106. Step 229 of annealing at high temperature provides more uniform distribution of the Group III atoms such as Ga and In. For example, absorber layer 106 comprises Ga, and the ratio of Ga at the upper surface to Ga at the bottom surface is in the range from 25% to 100%.

Referring back to FIG. 2A, at step 205, a surface layer 107-2 is formed on absorber layer 106. FIG. 2D and FIG. 6 illustrate an exemplary method 230 of forming a surface layer 107-2 on absorber layer 106 in accordance with some embodiments.

At step 232, a metal precursor 107-1 comprising a Group III element is deposited above absorber layer 106. Step 232 can be performed before or when step 234 is performed. Examples of a suitable Group III element can include any suitable material comprising Al, Ga, In or Tl.

At step 234, a selenium-containing precursor is deposited at a temperature ($T_5$ in FIG. 6), for example, in the range of from 200° C. to 520° C. (e.g., from 300° C. to 400° C.). The selenium-containing precursor can comprise hydrogen selenium, elemental selenium vapor or any other suitable material. The time length ($t_5$) for depositing selenium-containing precursor can be in the range of from 0.1 to 300 minutes. The structure of the resulting photovoltaic device after step 234 is illustrated in FIG. 1C.

In some embodiments, when steps 232 and 234 are simultaneously performed, a selenium-containing precursor and a precursor comprising a Group III element are co-deposited to form layer 107-1.

At step 236, a sulfur-containing precursor is deposited onto the selenium-containing precursor at a temperature ($T_6$ in FIG. 6), for example, in the range of from 200° C. to 520° C. (e.g., from 400° C. to 500° C.). The sulfur-containing precursor can comprise hydrogen sulfur, elemental sulfur vapor or any other suitable material. The time length ($t_6$) for depositing sulfur-containing precursor can be in the range of from 0.1 to 300 minutes. The structure of the resulting photovoltaic device after step 236 is illustrated in FIG. 1D.

In some embodiments, as shown in FIG. 6, the selenium-containing precursor is deposited at a temperature ($T_5$) lower than the temperature ($T_6$) at which the sulfur-containing precursor is deposited.

During steps 234 and possibly 236, a Group I element (e.g., Cu or Ag) in absorber layer 106 may diffuse into layer 107-1 to form a compound comprising a Group I element, a Group III element, and a Group VI element such as selenium. The stoichiometric ratio (atomic ratio) of the Group I element to the Group III element in layer 107-1 is less than 1 in some embodiments. At step 234, sulfur can diffuse into layer 107-1 and replace selenium to form a I-III-VI$_2$ compound, in which the atomic content of the Group III is higher than that of the Group I element. This compound is also referred as "Group I poor" compound. For example, as shown in FIG. 3, a "Cu-poor" compound, i.e. $Cu_xIn_ySe_2$, can be formed in the Cu—In—Se phase diagram, wherein x/y<1. After step 234, the Cu-poor compound is $CuxIny(S,Se)_2$.

FIG. 7 illustrates a resulting profile of Group I and Group III atoms distributed across absorber layer 106 in some embodiments. As shown in FIG. 7, absorber layer 106 has an atomic ratio of the Group I element to the Group III element close to 1, for example, in the range of from 0.9 to 1. In surface layer 107-2, an atomic ratio of the Group I element to the Group III element is in the range of from 0.1 to 0.9, for example, in the range from 0.1 to 0.7 (e.g., from 0.5 to 0.7). In some embodiments, the thickness of absorber layer 106 is in the range of 500 nm to 2 microns. The thickness of surface layer 107-2 can be in the range of 10 nm to 100 nm.

Figure 8:
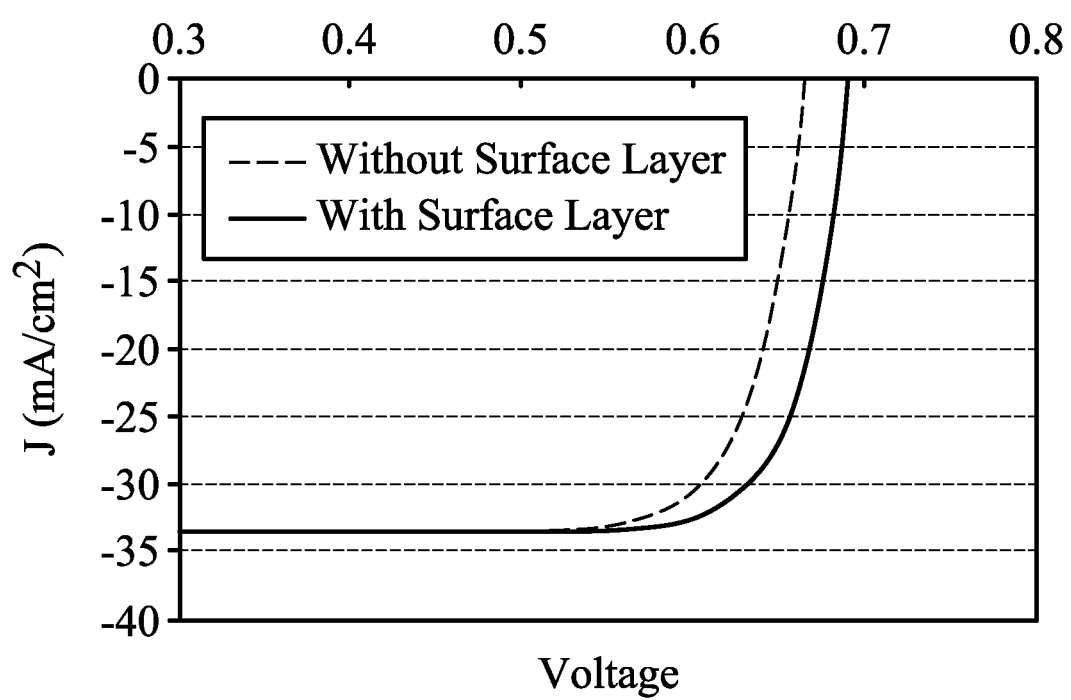
FIG. 8 shows that an exemplary photovoltaic device comprising an absorber layer having a surface layer in accordance with some embodiments has improved open-circuit voltage and fill factor.

As shown in FIG. 8, the resulting surface layer 107-2 on absorber layer 106 can provide improved open circuit voltage (Voc) and fill factor (FF), and further improve efficiency, reliability and overall performance of resulting photovoltaic devices. Such a surface layer 107-2 provides an enlarged band gap and an inverted carrier (e.g., n-type carrier) to form a buried junction with absorber layer 106 (e.g., p-type absorber layer).

Referring back to FIG. 2A, at step 206, a buffer layer 108 (not shown) comprising a buffer material is formed over absorber layer 106. Examples of a buffer material include but are not limited to ZnS, CdS, CdSe, ZnO, ZnSe, $ZnIn_2Se_4$, $CuGaS_2$, $In_2S_3$, MgO and $Zn_{0.8}Mg_{0.2}O$ in some embodiments. Such a buffer material can be an n-type semiconductor and absorber layer 106 comprises p-type GIGS in some embodiments. The thickness of buffer layer 108 is on the order of nanometers, for example, in the range of from 5 nm to 100 nm in some embodiments.

Formation of buffer layer 108 can be achieved through a suitable process such as sputtering, chemical vapor deposition, and a hydrothermal reaction or chemical bath deposition (CBD) in a solution. For example, buffer layer 108 comprising ZnS can be formed in an aqueous solution comprising $ZnSO_4$, ammonia and thiourea at 80° C. A suitable solution comprises 0.16M of $ZnSO_4$, 7.5M of ammonia, and 0.6 M of thiourea in some embodiments.

At step 208, a front contact layer or front transparent layer 110 (not shown) is formed over buffer layer 108. As a part of "window layer," front transparent layer 110 can also comprise two layers, for example, including an intrinsic ZnO (i-ZnO) layer and a front contact layer comprising transparent conductive oxide (TCO) or any other transparent conductive coating in some embodiments. In some embodiments, undoped i-ZnO is used to prevent short circuiting in the photovoltaic device 100. In thin film solar cells, the film thickness of absorber layer 106 can range from several nanometers to tens of micrometers. If front contact layer 114 and back contact layer 104 are unintentionally connected because of defects in the thin films, an unwanted short circuit (shunt path) will be provided. Such phenomenon decreases performance of the photovoltaic devices, and can cause the devices to fail to operate within specifications. The loss of efficiency due to the power dissipation resulting from the shunt paths can be up to 100%. In some embodiments, undoped i-ZnO is thus provided in between the front- and the back contact layers to prevent short circuiting, for example, above buffer layer 108, between the buffer layer 108 and the front contact layer. Intrinsic ZnO having high electrical resistance can mitigate the shunt current and reduce formation of the shunt paths.

Front contact layer 110 is used in a photovoltaic (PV) device with dual functions: transmitting light to an absorber layer while also serving as a front contact to transport photogenerated electrical charges away to form output current. Transparent conductive oxides (TCOs) are used as front contacts in some embodiments. In some other embodiments, front contact layer is made of a transparent conductive coating comprising nanoparticles such as metal nanoparticles or nanotubes such as carbon nanotubes (CNT). Both high electrical conductivity and high optical transmittance of the transparent conductive layer are desirable to improve photovoltaic efficiency.

Examples of a suitable material for the front contact layer 110 include but are not limited to transparent conductive oxides such as indium tin oxide (ITO), fluorine-doped tin oxide (FTO), aluminum-doped zinc oxide (AZO), gallium doped ZnO (GZO), alumina and gallium co-doped ZnO (AGZO), boron doped ZnO (BZO), and any combination thereof. A suitable material can also be a composite material comprising at least one of the transparent conductive oxide (TCO) and another conductive material, which does not significantly decrease electrical conductivity or optical transparency of front contact layer. The thickness of front contact layer is in the order of nanometers or microns, for example in the range of from 0.3 nm to 2.5 µm in some embodiments.

An anti-reflection layer can be also is formed over front transparent layer 110 in some embodiments. Examples of a suitable material for anti-reflection layer 116 include but are not limited to $SiO_2$ and $MgF_2$.

In another aspect, the present disclosure also provides a method of fabricating a photovoltaic device 100. The method comprises forming back contact layer 104 above substrate 102, forming absorber layer 106 above substrate 102, and forming surface layer 107-2 on absorber layer 106 as described above.

The present disclosure also provides a photovoltaic device 100 comprising substrate 102, back contact layer 104 disposed above substrate 102, absorber layer 106 comprising an absorber material disposed above back contact layer 104, and a surface layer 107-2 on absorber layer 106. Such layers are described above. Absorber layer 106 comprises a I-III-$VI_2$ compound comprising a Group I element, a Group III element and a Group VI element. Surface layer 107-2 comprises a I-III-$VI_2$ compound, which comprising a Group I element, a Group III element and a Group VI element, and has an atomic ratio of the Group I element to the Group III element in the range of from 0.1 to 0.9. In some embodiments, such a ratio is in the range of from 0.1 to 0.7, for example, from 0.5 to 0.7. In some embodiments, the thickness of absorber layer 106 is in the range of 500 nm to 2 microns. The thickness of surface layer 107-2 can be in the range of 10 nm to 100 nm. Photovoltaic device 100 can further comprise buffer layer 108 disposed over absorber layer 106. Photovoltaic device 100 can further comprise a front transparent layer 110 disposed above buffer layer 108 and an anti-reflection layer 116 disposed above front contact layer 110.

The present disclosure provides a method of fabricating a photovoltaic device. The method comprises a step of forming an absorber layer above a substrate, and a step of forming a surface layer on the absorber layer. The absorber layer comprises a I-III-$VI_2$ compound comprising a Group I element, a Group III element and a Group VI element. The surface layer comprises a I-III-$VI_2$ compound, which comprises a Group I element, a Group III element and a Group VI element, and has an atomic ratio of the Group I element to the Group III element in the range of from 0.1 to 0.9. In the I-III-$VI_2$ compound in the absorber layer or in the surface layer, the Group I element can be selected from Cu or Ag, and the Group III element can be selected from Al, Ga, In or Tl. The Group VI element in the I-III-VI2 compound in the absorber layer or in the surface layer can be selected S or Se. In some embodiments, the atomic ratio of the Group I element to the Group III element in the I-III-VI2 compound in the surface layer is in the range of from 0.1 to 0.7, for example, from 0.5 to 0.7.

In some embodiments, the step of forming an absorber layer comprises the following steps: forming a metal precursor layer above a substrate, depositing a selenium-containing precursor onto the metal precursor layer at a temperature in the range of from 200° C. to 800° C., annealing the photovoltaic device in an inert gas at a temperature in the range of from 200° C. to 800° C., and depositing a sulfur-containing precursor onto the metal precursor layer at a temperature in the range of from 200° C. to 600° C. after the step of annealing the photovoltaic device. The metal precursor comprises a material selected from the group consisting of a Group I element, a Group III element, an alloy or any combination thereof.

In some other embodiments, the step of forming an absorber layer comprises the following steps: forming a metal precursor layer above a substrate, depositing a sulfur-containing precursor onto the metal precursor layer at a temperature in the range of from 300° C. to 550° C., depositing a selenium-containing precursor onto the metal precursor layer after the step of depositing a sulfur-containing precursor, and annealing the photovoltaic device at a temperature in the range of from 500° C. to 800° C. The metal precursor comprises a material selected from the group consisting of a Group I element, a Group III element, an alloy or any combination thereof. In some embodiments, the step of depositing a selenium-containing precursor onto the metal precursor layer comprises two steps: depositing a selenium-containing precursor at a temperature in the range of from 25° C. to 350° C., and depositing a selenium-containing precursor at a temperature in the range of from 400° C. to 600° C.

In some embodiments, the step of forming a surface layer on the absorber layer comprises the following steps: depositing a selenium-containing precursor at a temperature in the range of from 200° C. to 520° C., and depositing a sulfur-containing precursor onto the selenium-containing precursor at a temperature in the range of from 200° C. to 520° C. The step of forming a surface layer on the absorber layer can further comprise depositing a metal precursor comprising a Group III element above the absorber layer before or when the selenium-containing precursor is deposited at a temperature in the range of from 200° C. to 520° C.

The present disclosure also provides a method of fabricating a photovoltaic device comprising the following steps: forming a back contact layer above a substrate, forming an absorber layer comprising a Group I element above the back contact layer, and forming a surface layer on the absorber layer. In some embodiments, the step of forming a surface layer comprises steps of depositing a selenium-containing precursor at a temperature (e.g., a temperature in the range from 25° C. to 520° C.), and depositing a sulfur-containing precursor at a temperature (e.g., a temperature in the range of from 200° C. to 520° C.). The step of forming a surface layer on the absorber layer further comprises depositing a metal precursor comprising a Group III element above the absorber layer before or when the selenium-containing precursor is deposited at a temperature, for example, in the range of from 200° C. to 520° C.

In some embodiments, in the step of forming a surface layer on the absorber layer, the selenium-containing precursor is deposited at a temperature lower than the temperature at which the sulfur-containing precursor is deposited. In some embodiments, in the step of forming a surface layer on the absorber layer, the selenium-containing precursor is deposited at a temperature in the range of from 300° C. to 400° C. The sulfur-containing precursor is deposited at a temperature in the range of from 400° C. to 500° C.

In another aspect, the present disclosure also provides a photovoltaic device. The photovoltaic device comprises a substrate, a back contact layer disposed above the substrate, an absorber layer disposed above the back contact layer, and a surface layer on the absorber layer. The absorber layer comprises a I-III-VI$_2$ compound comprising a Group I element, a Group III element and a Group VI element. The surface layer comprises a I-III-VI$_2$ compound, which comprising a Group I element, a Group III element and a Group VI element, and has an atomic ratio of the Group I element to the Group III element in the range of from 0.1 to 0.9. In some embodiments, the atomic ratio of the Group I element to the Group III element in the I-III-VI2 compound in the surface layer is in the range of from 0.1 to 0.7, for example, from 0.5 to 0.7. In some embodiments, the thickness of the absorber layer is in the range of 500 nm to 2 microns. The thickness of the surface layer on the absorber layer can be in the range of 10 nm to 100 nm. In some embodiments, the photovoltaic device further comprises a buffer layer disposed over the absorber layer, and a front transparent layer disposed over the buffer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a photovoltaic device, comprising
forming an absorber layer above a substrate, the absorber layer comprising a I-III-VI$_2$ compound comprising a Group I element, a Group III element and a Group VI element; and
forming a surface layer on the absorber layer, the surface layer comprising a I-III-VI$_2$ compound comprising a Group I element, a Group III element and a Group VI element, and having an atomic ratio of the Group I element to the Group III element in the range of from 0.1 to 0.9.

2. The method of claim 1, wherein
the Group I element in the I-III-VI$_2$ compound in the absorber layer or in the I-III-VI$_2$ compound in the surface layer is selected from a group consisting of Cu and Ag.

3. The method of claim 1, wherein
the Group III element in the I-III-VI$_2$ compound in the absorber layer or in the I-III-VI$_2$ compound in the surface layer is selected from a group consisting of Al, Ga, In and Tl.

4. The method of claim 1, wherein
The Group VI element in the I-III-VI$_2$ compound in the absorber layer or in the I-III-VI$_2$ compound in the surface layer is selected from a group consisting of S and Se.

5. The method of claim 1, wherein
the atomic ratio of the Group I element to the Group III element in the I-III-VI$_2$ compound in the surface layer is in the range of from 0.1 to 0.7.

6. The method of claim 1, wherein
the atomic ratio of the Group I element to the Group III element in the I-III-VI$_2$ compound in the surface layer is in the range of from 0.5 to 0.7.

7. The method of claim 1, wherein the step of forming an absorber layer comprises
forming a metal precursor layer above a substrate, the metal precursor comprising a material selected from the group consisting of a Group I element, a Group III element, an alloy or any combination thereof;
depositing a selenium-containing precursor onto the metal precursor layer at a temperature in the range of from 200° C. to 800° C.;
annealing the photovoltaic device in an inert gas at a temperature in the range of from 200° C. to 800° C.; and
depositing a sulfur-containing precursor onto the metal precursor layer at a temperature in the range of from 200° C. to 600° C. after the step of annealing the photovoltaic device.

8. The method of claim 1, wherein the step of forming an absorber layer comprises
forming a metal precursor layer above a substrate;
depositing a sulfur-containing precursor onto the metal precursor layer at a temperature in the range of from 300° C. to 550° C.;
depositing a selenium-containing precursor onto the metal precursor layer after the step of depositing a sulfur-containing precursor; and
annealing the photovoltaic device at a temperature in the range of from 500° C. to 800° C.

9. The method of claim 8, wherein the step of depositing a selenium-containing precursor onto the metal precursor layer comprises:
depositing a selenium-containing precursor at a temperature in the range of from 25° C. to 350° C.; and
depositing a selenium-containing precursor at a temperature in the range of from 400° C. to 600° C.

10. The method of claim 1, wherein the step of forming a surface layer on the absorber layer comprises
depositing a selenium-containing precursor at a temperature in the range of from 200° C. to 520° C.; and
depositing a sulfur-containing precursor onto the selenium-containing precursor at a temperature in the range of from 200° C. to 520° C.

11. The method of claim 10, wherein the step of forming a surface layer on the absorber layer further comprises
depositing a metal precursor comprising a Group III element above the absorber layer before or when the selenium-containing precursor is deposited at a temperature in the range of from 200° C. to 520° C.

12. A method of fabricating a photovoltaic device according to claim 1, further comprising
forming a back contact layer above the substrate;
wherein the step of forming a surface layer comprises:
depositing a selenium-containing precursor at a temperature in the range of from 25° C. to 520° C.; and
depositing a sulfur-containing precursor at a temperature in the range of from 200° C. to 520° C.

13. A method of claim 12, wherein the step of forming a surface layer on the absorber layer further comprises
depositing a metal precursor comprising a Group III element above the absorber layer before or when the selenium-containing precursor is deposited at a temperature in the range of from 200° C. to 520° C.

14. The method of claim 12, wherein in the step of forming a surface layer on the absorber layer, the selenium-containing precursor is deposited at a temperature lower than the temperature at which the sulfur-containing precursor is deposited.

15. The method of claim 12, wherein in the step of forming a surface layer on the absorber layer, the selenium-containing precursor is deposited at a temperature in the range of from 300° C. to 400° C., and the sulfur-containing precursor is deposited at a temperature in the range of from 400° C. to 500° C.

\* \* \* \* \*